(12) United States Patent
Yang

(10) Patent No.: US 8,115,297 B2
(45) Date of Patent: Feb. 14, 2012

(54) SUBSTRATE STRUCTURE WITH DIE EMBEDDED INSIDE AND DUAL BUILD-UP LAYERS OVER BOTH SIDE SURFACES AND METHOD OF THE SAME

(75) Inventor: Wen-Kun Yang, Hsin-Chu (TW)

(73) Assignee: King Dragon International Inc., Tortola (VG)

( * ) Notice: Subject to any disclaimer, the term of this patent is extended or adjusted under 35 U.S.C. 154(b) by 41 days.

(21) Appl. No.: 12/591,812

(22) Filed: Dec. 2, 2009

(65) Prior Publication Data

US 2010/0078655 A1    Apr. 1, 2010

Related U.S. Application Data

(63) Continuation of application No. 12/232,847, filed on Sep. 25, 2008.

(51) Int. Cl.
*H01L 23/48* (2006.01)
(52) U.S. Cl. ......... 257/692; 257/684; 257/685; 257/700
(58) Field of Classification Search ................. 257/684, 257/685, 686, 692, 700, 774, E23.06, E23.001, 257/E23.141, E23.142, E23.145, E23.169, 257/E21.505
See application file for complete search history.

(56) References Cited

U.S. PATENT DOCUMENTS

| 6,239,482 | B1* | 5/2001 | Fillion et al. | 257/678 |
|---|---|---|---|---|
| 6,271,469 | B1* | 8/2001 | Ma et al. | 174/521 |
| 6,506,632 | B1* | 1/2003 | Cheng et al. | 438/126 |
| 2007/0163645 | A1* | 7/2007 | Gonda et al. | 136/263 |
| 2008/0121269 | A1* | 5/2008 | Welser et al. | 136/246 |
| 2008/0237828 | A1* | 10/2008 | Yang | 257/690 |
| 2008/0237879 | A1* | 10/2008 | Yang | 257/774 |
| 2009/0277493 | A1* | 11/2009 | Merkle | 136/246 |
| 2009/0277496 | A1* | 11/2009 | Khazeni et al. | 136/246 |

* cited by examiner

*Primary Examiner* — N Drew Richards
*Assistant Examiner* — Joannie A Garcia
(74) *Attorney, Agent, or Firm* — Bacon & Thomas, PLLC

(57) ABSTRACT

The present invention comprises a first substrate with a die formed on a die metal pad, a first and a second wiring circuits formed on the surfaces of the first substrate. A second substrate has a die opening window for receiving the die, a third wiring circuit is formed on top surface of the second substrate and a fourth wiring circuit on bottom surface of the second substrate. An adhesive material is filled into the gap between back side of the die and top surface of the first substrate and between the side wall of the die and the side wall of the die receiving through hole and the bottom side of the second substrate. During the formation, laser is introduced to cut the backside of the first substrate and an opening hole is formed in the first substrate to expose a part of the backside of the Au or Au/Ag metal layer of chip/die.

15 Claims, 11 Drawing Sheets

SUBSTRATE STRUCTURE WITH DIE EMBEDDED INSIDE AND DUAL BUILD-UP LAYERS OVER BOTH SIDE SURFACES AND METHOD OF THE SAME

The invention is relative to Continuation-In-Part (CIP) of application Ser. No. 12/232,847 that filing on date Sep. 25$^{th}$, 2008 by the inventor.

FIELD OF THE INVENTION

This invention relates to a substrate structure with embedded dice inside to form panel level packaging, and more particularly to a fan-out panel level package with dual build up layers formed over the both side-surfaces to improve the reliability and to reduce the device size, especially in thermal management and body thickness.

DESCRIPTION OF THE PRIOR ART

In the field of semiconductor devices, the device density is increased and the device dimension is reduced, continuously. The demand for the packaging or interconnecting techniques in such high density devices is also increased to fit the situation mentioned above. Conventionally, in the flip-chip attachment method, an array of solder bumps is formed on the surface of the die. The formation of the solder bumps may be carried out by using a solder composite material through a solder mask for producing a desired pattern of solder bumps. The function of chip package includes power distribution, signal distribution, heat dissipation, protection and support, and so on. As a semiconductor become more complicated, the traditional package technique, for example lead frame package, flex package, rigid package technique, can't meet the demand of producing smaller chip with high density elements on the chip.

Furthermore, because conventional package technologies have to divide a dice on a wafer into respective dies and then performing the wire bonding process by wire to package the die respectively. Therefore, these techniques are time consuming for manufacturing process. Since the chip package technique is highly influenced by the development of integrated circuits, therefore, as the size of electronics has become demanding, so does the package technique. For the reasons mentioned above, the trend of package technique is toward ball grid array (BGA), flip chip (FC-BGA), chip scale package (CSP), Wafer level package (WLP) today. "Wafer level package" is to be understood as meaning that the entire packaging and all the interconnections on the wafer as well as other processing steps are carried out before the singulation (dicing) into chips (dice). Generally, after completion of all assembling processes or packaging processes, individual semiconductor packages are separated from a wafer having a plurality of semiconductor dice. The wafer level package has extremely small dimensions combined with extremely good electrical properties.

WLP technique is an advanced packaging technology, by which the dice are manufactured and tested on the wafer, and then the wafer is singulated by dicing for assembly in a surface-mount line. Because the wafer level package technique utilizes the whole wafer as one object, not utilizing a single chip or die, therefore, before performing a scribing process, packaging and testing has been accomplished. Furthermore, WLP is such an advanced technique so that the process of wire bonding, die mount, molding and/or under-fill can be omitted. By utilizing WLP technique, the cost and manufacturing time can be reduced, and the resulting structure of WLP can be equal to the die; and therefore, this technique can meet the demands of miniaturization of electronic devices.

Though the advantages of WLP technique mentioned above, some issues still exist influencing the acceptance of WLP technique. For instance, the CTE difference (mismatching) between the materials of a structure of WLP and the mother board (PCB) becomes another critical factor to mechanical instability of the structure, the total terminal array number be limited by chip size area and no way to do the multi-chip and system in package by using entire silicon wafer before dicing the wafer. A package scheme disclosed by U.S. Pat. No. 6,239,482B1 (FIG. 15) suffers the mechanical bending issue. It is because the prior art uses silicon die 12 embedded into the substrate 18 or core area and only supporting by adhesive material 20 to support the die 12. As known, during the mechanical bending, the hardness and material properties of silicon die and substrate material 18 and the adhesive material 20 are different, the bending effect will cause the materials boundary crack and impact the metal lines (RDL) 32 were broken, that causing the reliability test failure at mechanical stress. Furthermore, it creates a poor reliability and yield due to the dielectric layer too thick (dielectric layers 22 and 16), and the CTE (Coefficient of Thermal Expansion) mismatching between dielectric layers 22, 16 and metal 30 and material 20, etc. A package scheme disclosed by U.S. Pat. No. 6,506,632B1 (FIG. 16) also faces the same mechanism issue.

Further, the prior art suffers complicated processes to form the "Panel substrate" type package. It needs the mold tool for encapsulation and the injection of mold material or dispenser to inject the adhesion materials. It is unlikely to control the surface of die and compound at same level due to warp after heat curing the compound or epoxy, the CMP process may be needed to polish the uneven surface. The cost is therefore increased.

SUMMARY OF THE INVENTION

For the aforementioned, the present invention provides a substrate structure which has embedded dice inside with stress buffer properties and shrinkage size to overcome the aforementioned problem and also provide the better board level reliability test of bending, vibration test etc.

The object of the present invention is to provide a fan-out panel level packaging with excellent CTE matching performance and shrinkage size.

The further object of the present invention is to provide a fan-out panel level packaging with a substrate having die opening window to improve the mechanical reliability and shrinking the device size.

The further object of the present invention is to provide a fan-out panel level packaging with a substrate having die opening window with metal on sidewall to act as the lighting reflector for light emitting packaging application, and to act as shelling.

The further object of the present invention is to provide a fan-out panel level packaging with a substrate opening to back side of die (to exposure) having sputtering metal (e.g. Cu or Ti/Cu) and E-plating Cu/Au or Cu/Ni/Au metal with pattern for increasing electrical conductivity and thermal conductivity performance.

The further object of the present invention is to provide a method of panel substrate which has embedded dice inside with simple way to redistribute the die/chip and substrate and fill into the adhesion materials as stress buffer layer to adhesive the several materials together to form the structure of panel substrate.

The further object of the present invention is to provide a fan-out panel level packaging having dual build-up layers for increasing the number of fan-out traces and provide the system in package solution. Therefore, the package of the present invention can improve the ability of heat dissipation through double build-up layer to redistribute the pitch of pads and dimension of conductive trace.

The further object of the present invention is to provide a method of panel substrate which has embedded sputtering metal (e.g. Cu or Ti/Cu) and E-plating Cu or Cu/Ni/Au metal with pattern inside with simple way for get better mechanical, electrical and thermal conductivity performance by adjusted the thickness of E-plating Cu or Cu/Ni/Au metal or designed the exposure pattern of opening holes area.

The present invention discloses a structure of substrate comprising: a first substrate with a die metal pads (it can be pad area and no necessary be metal) and a wiring pattern on both side (top and bottom), a die has back side with adhesion material attached on said die metal pads of said first substrate; a second substrate with die opening window and wiring pattern on both side; a adhesive materials (stress buffer materials) filled into the gap between back side of the die and top surface of the first substrate and between the side wall of the die and the side wall of the die opening window and the bottom side of the second substrate. The present invention further comprises forming the build up layers on both sides which includes the UBM structure on both side; further to form the surface mounting process for soldering join the other WL-CSP, CSP, BGA/LGA, flip chips etc and passive components onto the top side surface becomes the system in package (SIP) structure.

The present invention further discloses a structure of substrate comprising: a first substrate with a die metal pad which can be pad area and a die backside opening hole, a metal layer embedded into said die backside opening hole, a wiring pattern on both side (i.e. top and bottom) includes CCL Cu and E-plating Cu, a die has back side with Au or Au/Ag layer (ex. Power device, Light Emitting Device, . . . ) to attached on said metal layer of first substrate, and other than the part of said Au or Au/Ag layer of the die attached on the metal layer of first substrate has back side with adhesion material attached on said die metal pads of first substrate; a second substrate with die opening window and wiring pattern on both side; a adhesive materials (stress buffer materials) filled into the gap between said Au or Au/Ag layer of the die bottom side and top surface of the first substrate, except the part of the die attached on the said metal layer of first substrate, and between the side wall of the die and the side wall of the die opening window and the bottom side of the second substrate. The present invention further comprises forming the build up layers on both sides which includes the UBM structure on both side; further to form the surface mounting process for soldering join the other WL-CSP, CSP, BGA/LGA, flip chips etc and passive components onto the top side surface becomes the system in package (SIP) structure.

The present invention further discloses a structure of substrate for light emitting packaging application comprises metal both on the sidewall and the edge corner of the opening hole of the first substrate by plating the Cu/Ni/Au or alloy, a wire to connect from anode to metal pads of the first substrate and lens by using either molding method or pre-made lens attached on the light emitting element. The edge corner/sidewall of the wiring pattern is utilized to act as "lighting reflector" which can reflect light from the light emitting element, such as the LED, and increase light efficiency of the light emitting element.

The material of the substrate includes epoxy type FR5, FR4, BT, silicon, PCB (print circuit board) material, glass or ceramic. Alternatively, the material of the substrate includes alloy or metal; it prefers to use the BT materials due to the properties of thin and high Tg and has fiber glass inside for better process window also the CTE (Coefficient of Thermal Expansion) of the BT substrate is close to the CTE of mother board (PCB) having CTE around 14 to 17. The adhesive materials are prefer to use the silicone rubber with filler with higher elongation, low dielectric constant, lower moisture uptake to act as stress buffer properties; for light emitting packaging application, it prefers to use the "see through" adhesive materials for better reflection from the metal on the sidewall of substrate. The material of the dielectric layer includes an elastic dielectric layer, a photosensitive layer, a silicone dielectric based layer, a siloxane polymer layer, a polyimides (PI) layer or silicone resin layer. In order to get better mechanical and electrical performance, said metal layer includes E-plating Cu or Cu/Au or Cu/Ni/Au metal, and formed on the sputtering metal, e.g. Cu or Ti/Cu, on the surface of said Au or Au/Ag layer of the die bottom side to increase adhesion performance. The sputtering metal also can be direct contacted on the bottom side of die without Au or Au/Ag if the die bottom does not have the metal originally.

The present invention further discloses a method for forming semiconductor device package comprising: providing a tool with alignment key and temporary pattern glues formed on top surface of the tool; aligning and attaching a second substrate on the temporary pattern glues by the alignment key; aligning and attaching a die on the temporary pattern glues by the alignment key, and the die disposed inside openings of the second substrate; printing adhesion material from the back side of the die and the bottom side of the second substrate; bonding a first substrate on the adhesion material to form a panel substrate (it needs to align the first substrate to match the die pads with back side of die—normally, it can be aligned with the alignment target on both first substrate and second substrate); and separating the panel substrate from the tool after releasing temporary pattern glues.

The method further comprises forming at least one built up layers on top surface of the die and the second substrate, and/or on bottom surface of the first substrate; the built up layer/wiring circuit on the first substrate can be pre-made during raw materials preparation. The method further comprises forming conductive through holes to connect the top and bottom wiring of the second substrate and top and bottom wiring of the first substrate. The temporary pattern glues have patterns to attached bonding pads of the die and via pads of the second substrate. The alignment key includes single die alignment key and alignment target for the second substrate. The die attached on the temporary pattern glues is performed by a pick and place fine alignment process. The panel substrate is separated from the tool by a thin mechanical knife (includes thin steel wire) and maybe under heat condition (high temperature environment).

The present invention further discloses a method for forming semiconductor device package comprising: using the laser to open the holes of the first substrate from backside (of die), and the laser beam would stop on said Au or Au/Ag layer of the die backside (ex. Using CO2 laser); using the sputtering metal (e.g. Cu or Ti/Cu) to form the seed metal layer, such as E-plating Cu or Cu/Au or Cu/Ni/Au metal with pattern, on the backside of said Au or Au/Ag layer of the die to connect the wiring circuit of the first substrate. Then, the metal pads are formed on the bottom surface of said metal layer of the first substrate, and said metal layer includes CCL Cu and E-plating Cu. Said method of panel substrate would get better mechanical, electrical and thermal conductivity performance due to direct contact the backside metal of die by adjusted the thickness of metal layer or designed the exposure pattern of opening holes area.

DESCRIPTION OF THE PREFERRED EMBODIMENT

The invention will now be described in greater detail with preferred embodiments of the invention and illustrations attached. Nevertheless, it should be recognized that the preferred embodiments of the invention is only for illustrating. Besides the preferred embodiment mentioned here, present invention can be practiced in a wide range of other embodiments besides those explicitly described, and the scope of the present invention is expressly not limited expect as specified in the accompanying Claims.

Figure 12:
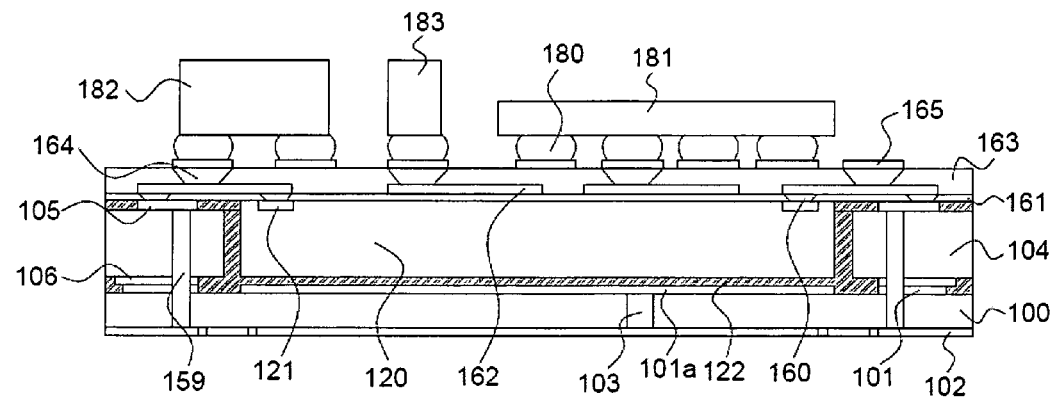
FIG. 12 illustrates a cross sectional view of system in package structure according to the present invention.

The present invention discloses a substrate structure with die (or multi-chips) embedded and dual build-up layers formed over the both side-surfaces, shown in FIG. 12, and it illustrates a cross sectional view of system in package (SIP) structure which includes a substrate having die embedded inside with double side build up layers and passive components, WL-CSP, CSP, BGA, Flip Chip etc. surface mounting on top build up layers and terminal pins on opposite side according to the present invention. The package structure includes a first substrate 100 with a die metal pad 101a (for heat dispatch), a wiring pattern 101 on top surface and a wiring pattern 102 on bottom surface of the first substrate 100. A connecting conductive through holes 103 may be formed for passing through the first substrate 100 connected to the wiring pattern 101, 102 for ground (GND) and heat sink. A die/chip 120 has back side with adhesive material 122 attached on the die metal pads 101a of the first substrate 100. The die 120 has Al pads 121 (I/O pads) formed therein. The die 120 is disposed within the die opening window of the second substrate 104 and attached on the adhesive material 122. A second substrate 104 is formed on the first substrate 100, with die opening window and a wiring pattern 105 on top surface and a wiring pattern 106 on bottom surface of the second substrate 104. The adhesion material (stress buffer) 122 is filled into the gap between back side of the die 120 and top surface of the first substrate 100 and between the side wall of the die 120 and the side wall of the die opening window and the bottom side of the second substrate 104. The adhesion material 122 is printed, coated or dispensed under the lower surface of the die 120, thereby sealing the die 120. In one embodiment, the adhesion material 122 covers on the top surface of the second substrate 104 and the surface of the die 120 except Al pads 121 and via of second substrate 104, and under the build up layers. The surface level of the die 120 and surface level of the second substrate 104 is at same level by the adhesion material 122. A conductive through holes 159 are formed by passing through the first substrate 100 and the second substrate 104 to connect the top and bottom wiring pattern 105 and 106 of the second substrate 104 and top and bottom wiring pattern 101 and 102 of the first substrate 100. In one embodiment, the conductive through holes 159 is connected to the die metal pads 101a and the bottom wiring 102 of the first substrate 100 for ground and heat dispatch. A first dielectric layer 161 is formed on the die 120 and the second substrate 104 with openings for via 160 formed therein, it prefers as thin as possible for the first dielectric layer 161 for better reliability concerning. A redistributed metal layers (RDL) 162 is formed on via 160 and first dielectric layer 161 for coupling to via 160. First build up layers is formed on top of the circuit side of the die 120 and on top of the surface of the second substrate 104. A second (top) dielectric layer 163 is formed on the first dielectric 161 and the RDL metal trace 162, with openings for UBM 164 formed thereon. Second build up layers may be formed under bottom side of the first substrate 100, or formed over the first build up layers, it means the third dielectric layer 400 forming on the bottom wiring circuit of the first substrate with via opening and RDL be formed on the third dielectric layer. Solder metal pads 165 are formed on the UBM (Under Bump Metallurgy) 164. Solder paste or solder join (conductive bumps) 180 is formed on the solder metal pads 165. A plurality of CSP, WL-CSP, BGA, flip chips and passive components 181, 182, 183 are soldering mounting (SMT) on metal pad, UBM of circuit side of the build up layers (the opposite of terminal metal pads) through the solder ball 180.

The dielectric layers 161 and 163, and the adhesion material 122 act as stress buffer area that absorbs the thermal mechanical stress between the die 120 and the second substrate 104 or the first substrate 100 during temperature cycling and bending due to the dielectric layers with elastic property. The aforementioned structure (SIP) constructs a LGA type package.

Preferably, the material of the first and second substrate 100 and 104 is organic substrate likes epoxy type FR5, BT, PCB. Preferably, CTE of the first and second substrate 100 and 104 is the same as the one of the mother board (PCB). Preferably, the organic substrate with high Glass transition temperature (Tg) are epoxy type FR5 or BT (Bismaleimide triazine) type substrate, the above materials can be easy to form the circuit pattern and inter-connecting through holes. The Cu metal (CTE around 16) can be used also. The glass, ceramic, silicon can be used as the substrate. The adhesion material 122 is preferably to form of silicone rubber based elastic materials.

It is because that the CTE (X/Y direction) of the epoxy type organic substrate (FR5/BT) is around 14-17 and the CTE in Z direction is about 30-60, and the CTE of the tool for chip redistribution can be selected to close CTE of the substrate, then, it can reduce the die shift issue during the temperature curing of the adhesion material. The FR5/BT is unlikely to return to original location after the temperature cycling (if the temperature is close to Glass transition temperature Tg) if using the materials with CTE mismatching that causes the die shift in panel form during the Panel Level Process which needs several high temperature process, for instant, the curing temperature of dielectric layers and adhesion material curing etc.

The first and second substrate could be round type such as wafer type, the diameter could be 200, 300 mm or higher. It could be employed for rectangular type such as panel form. Preferably, the large panel size (same as the size was manufactured in substrate/FPC process) is recommended because it can fully utilize the equipments of substrate or FPC (Flexible Printed Circuit) etc. also the unit cost can be reduced too.

In one embodiment of the present invention, the first and second dielectric layers 161 and 163 are preferably an elastic dielectric material which is made by silicone dielectric based materials comprising siloxane polymers, Dow Corning WL5000 series, and the combination thereof. In another embodiment, the first and second dielectric layers 161 and 163 are made by a material comprising, polyimides (PI) or silicone based resin. Preferably, they are photosensitive layers for simple process.

In one embodiment of the present invention, the elastic dielectric layer is a kind of material with CTE larger than 100 (ppm/° C.), elongation rate about 40 percent (preferably 30 percent-50 percent), and the hardness of the material is between plastic and rubber. The thickness of the elastic dielectric layers depend on the stress accumulated in the RDL/dielectric layer interface during temperature cycling test.

In one embodiment of the invention, the material of the RDL comprises Ti/Cu/Au alloy or Ti/Cu/Ni/Au alloy; the thickness of the RDL is the range of 2 um and 15 um (it also can be thicker to 25 um if it is needed). The Ti/Cu alloy is formed by sputtering technique also as seed metal layers, and the Cu/Au or Cu/Ni/Au alloy is formed by electroplating; exploiting the electro-plating process to form the RDL can make the RDL thick enough and better mechanical properties to withstand CTE mismatching during temperature cycling and mechanical bending. The metal pads can be Al or Cu or combination thereof.

Figure 20:
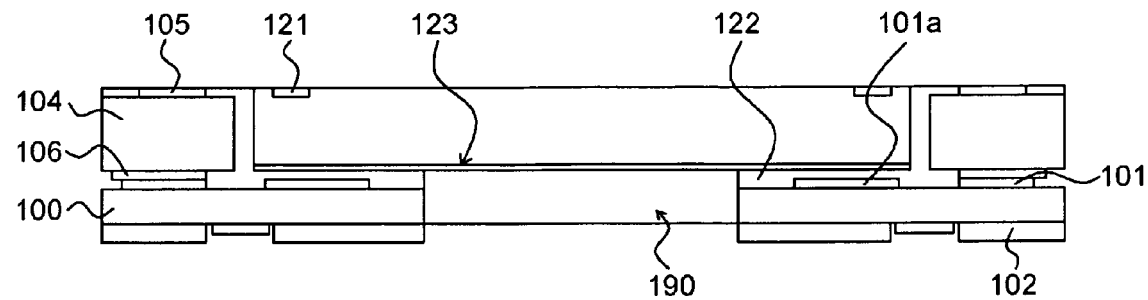
FIG. 20 illustrates a cross-sectional view of the substrate with opening hole to the present invention.
Figure 21:
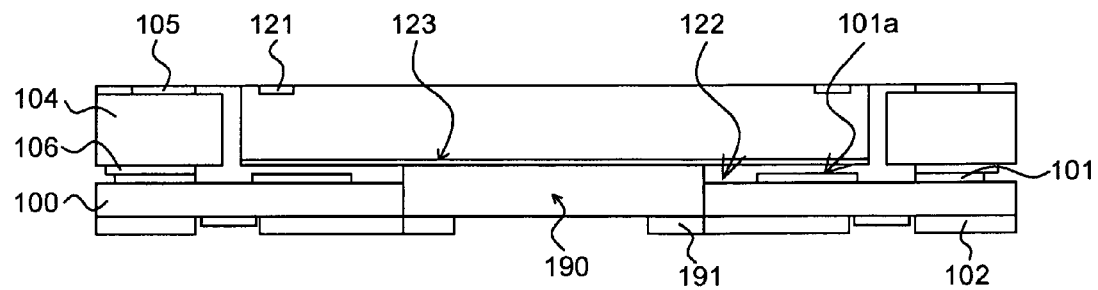
FIG. 21 illustrates a cross sectional view of system in package structure according to the present invention.

In one embodiment of the invention, a first substrate 100 with a die metal pad 101*a* and a die opening hole, a metal layer 190 embedded into the die opening hole, contacting between the backside of the die 120 and the wiring circuit 102 of the first substrate; and a wiring pattern 101 is formed on top surface and a wiring is patterned 102 on bottom surface of the first substrate 100, as shown in FIG. 20, which wiring pattern 101, 102 includes CCL Cu and E-plating Cu. The die metal pad 101*a* can be a pad area, better thermal dispersion is the primarily beneficial gained from the arrangement. A chip/die 120 has back side with Au or Au/Ag layer 123 to attach on the metal layer 190 of the first substrate 100, and other than the part of said Au or Au/Ag layer 123 of the die 120 attached on the metal layer 190 of the first substrate 100 having back side with adhesion material 122 attached on the die metal pads 101*a* of the first substrate 100. The die 120 has Al pads 121 (I/O pads) formed therein. The die 120 is disposed within the die opening window of the second substrate 104 and attached on the adhesive material 122. A second substrate 104 is formed on the first substrate 100, with die opening window and a wiring pattern 105 on top surface and a wiring pattern 106 on bottom surface of the second substrate 104. The adhesive materials (stress buffer materials) 122 are filled into the gap between the Au or Au/Ag layer 123 of the die 120 bottom side and top surface of the first substrate 100, except the part of the die 120 attached on the metal layer 190 of the first substrate 100, and between the side wall of the die 120 and the side wall of the die opening window and the bottom side of the second substrate 104. The adhesion material 122 is printed, coated or dispensed under the lower surface of the die 120, thereby sealing the die 120. The metal layer includes E-plating Cu or Cu/Au or Cu/Ni/Au metal with pattern, if it is necessary, in order to get better mechanical and electrical performance by adjusting the thickness of metal layer or designed the exposure pattern of opening holes area, and Cu/Ni/Au metal is formed by sputtering/plating technique. The die 120 has sputtering metal (e.g. Cu or Ti/Cu) on the surface of said Au or Au/Ag layer 123 of the die bottom side to increase adhesion performance.

Figure 23:
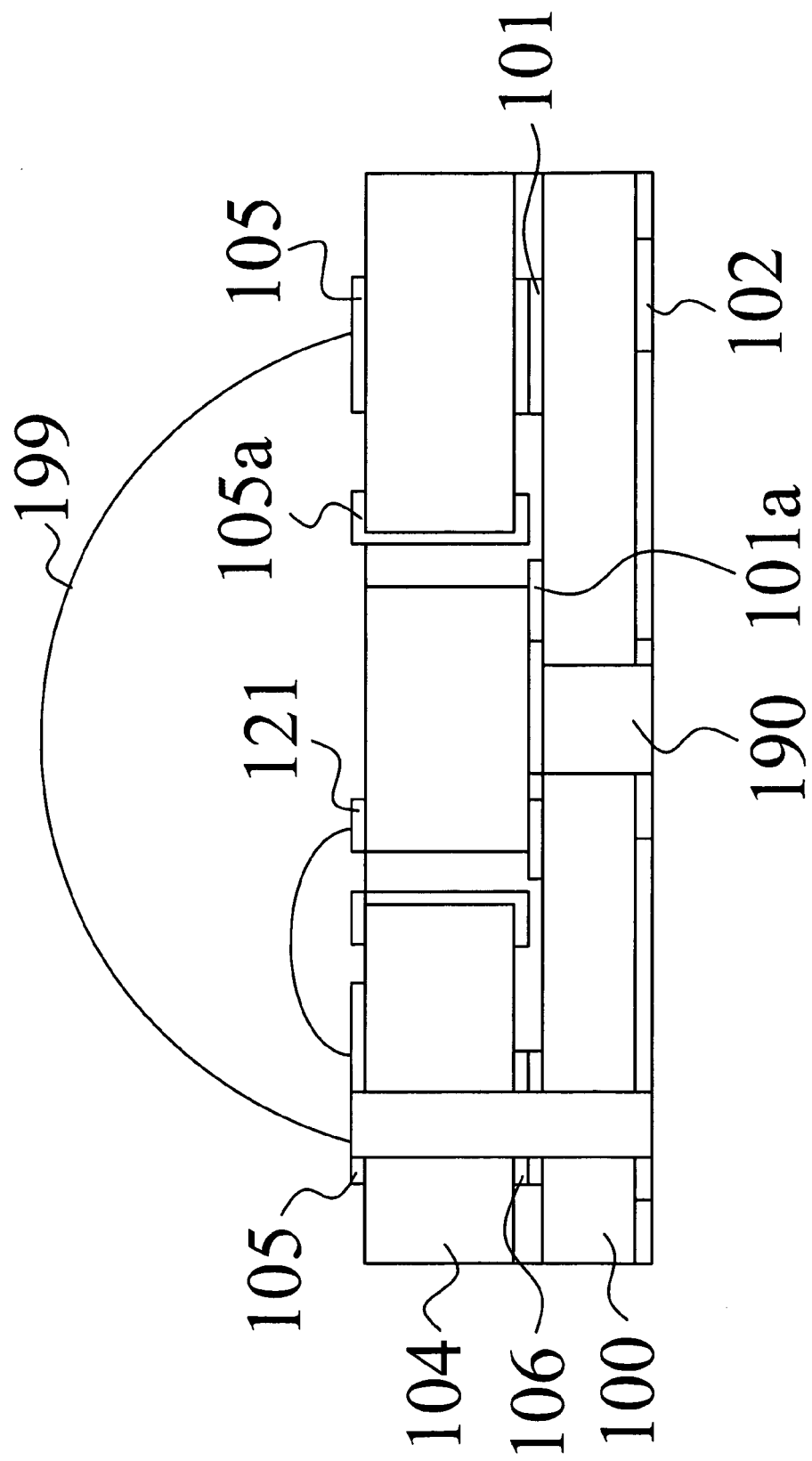
FIG. 23 illustrates a cross section view of light emitting package structure according to present invention.

In one embodiment of the invention, the FIG. 23 has shows second substrate 104 with die opening window has the metal 105*a* on the sidewall of opening window, and adhesion material 122 be used "see through" type are filled into the gap between the sidewall of die 120 and metal sidewall 105*a* (includes edge corner) of second substrate 104, this application be used for light emitting package and the metal sidewall 105*a* be acted as reflector; The lens 199 be disposed on the light emitting element, it can be used either molding method or pre-made lens attached on the light emitting element.

Figure 1:
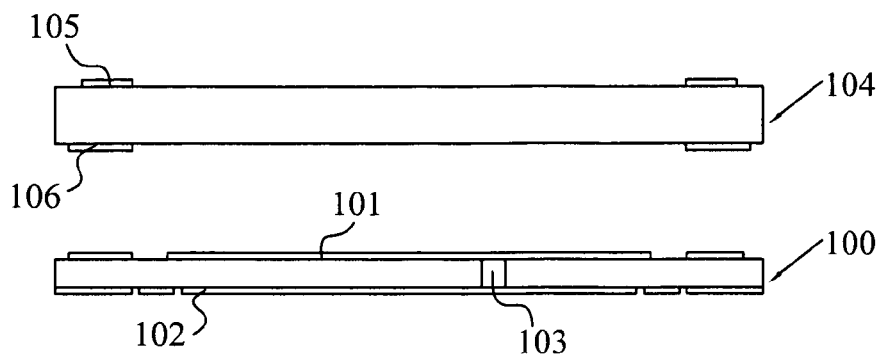
FIG. 1 illustrates a cross-sectional view of a raw structure of substrate according to the present invention.
Figure 2:
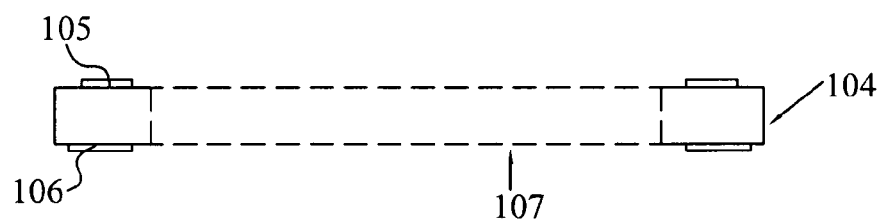
FIG. 2 illustrates a cross-sectional view of the substrate with die opening window according to the present invention.

The processes of forming a substrate structure with embedded dice inside of the present invention include preparing a first substrate 100 and a second substrate 104 (preferably organic substrate FR4/FR5/BT raw material) and contact metal pads 101, 102 as wiring circuit are formed on top and bottom surface of the first substrate 100 respectively, and contact metal pads 105, 106 as wiring circuit pattern for die attached are formed on top and bottom surface of the second substrate 104 respectively, shown in FIG. 1. The contact metal pads 101, 102, 105 and 106 and die metal pads 101a of substrates may be formed by E-plating with Cu/Ni/Au. The connecting conductive through holes 103 may be formed by passing through the first substrate 100 connected to the die metal pads 101a and contact metal pads 102 for grounding (GND) and heat sink (it could be pre-made during making substrate). The die opening window 107 is formed with the size larger than die size plus around 100 um-200 um per side by laser cutting or mechanical punching (multiple dice puncher), shown in FIG. 2. The depth is close (or about 25 um thick than) to the thickness of dice thickness.

Figure 3:
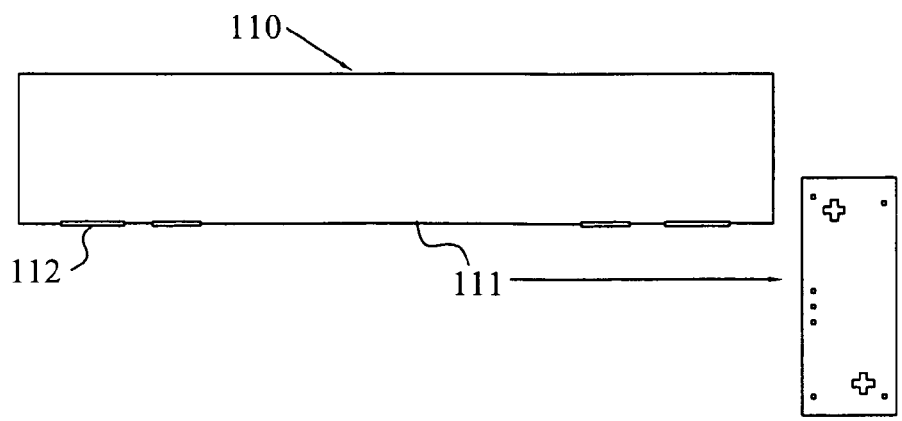
FIG. 3 illustrates a cross-sectional view of the die redistribution tools with alignment pattern and temporary glue on the top surface according to the present invention.

The next step is providing the tools 110 with alignment key 111 (top view of a single die) and temporary pattern glues 112 formed on top surface of the tool 110 for die/substrate placement and alignment, shown in FIG. 3. The alignment key 111 of the tools 110 includes single die alignment key and the alignment target for the second substrate 104. The temporary pattern glue 112 is preferably to cover Al pads of die and metal via of substrates, but it need balance design to keep die surface in flatness level. The temporary pattern glue 112 is printed on the tool 110 for sticking the surface of dice and the second substrate. The temporary pattern glue 112 with pattern to attach the Al bonding pads 121 of the die 120 and via metal pads 105 of the second substrate 104.

Figure 4:
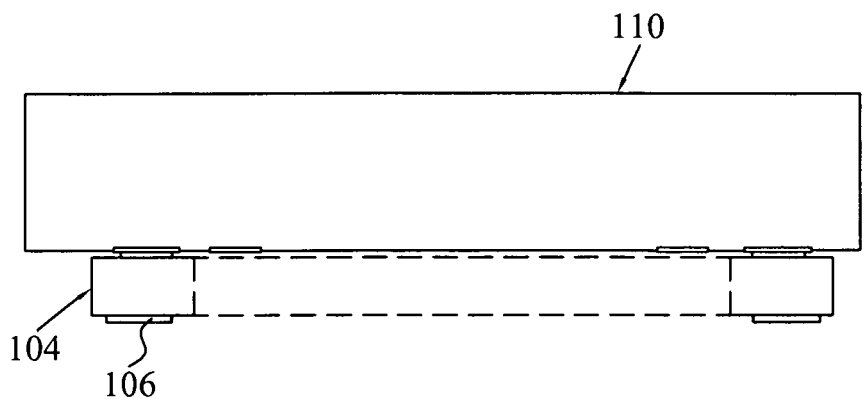
FIG. 4 illustrates a cross sectional view of the second substrate with die opening window bonded onto the tools according to the present invention.
Figure 5:
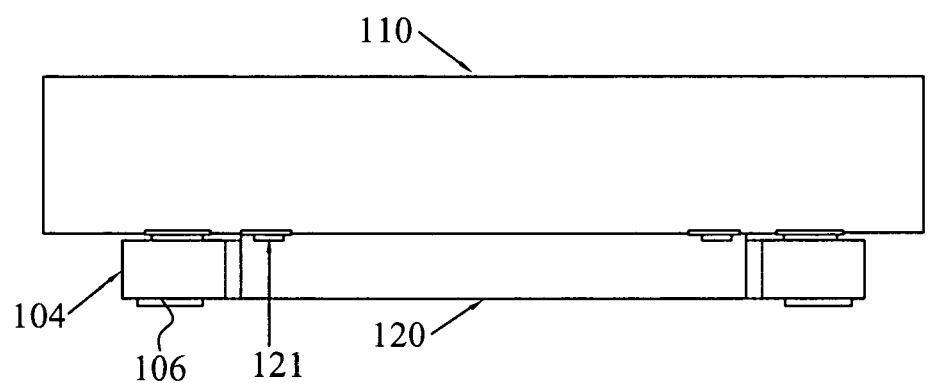
FIG. 5 illustrates a cross sectional view of the die and second substrate with die opening window bonded onto the tools according to the present invention.
Figure 6:
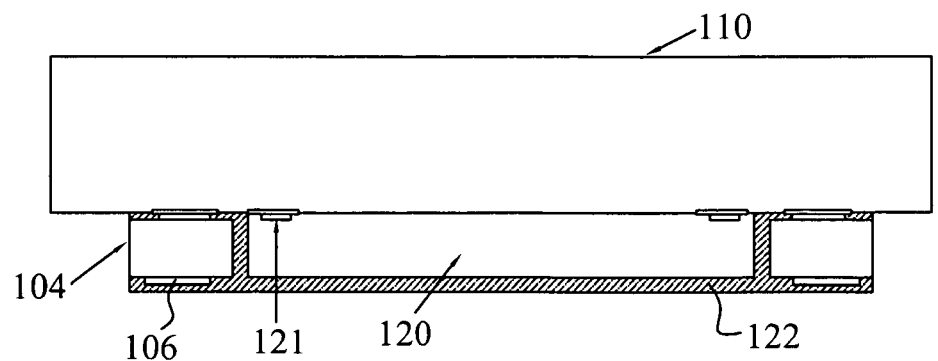
FIG. 6 illustrates a cross sectional view of the adhesive material filled into the panel substrate according to the present invention.
Figure 7:
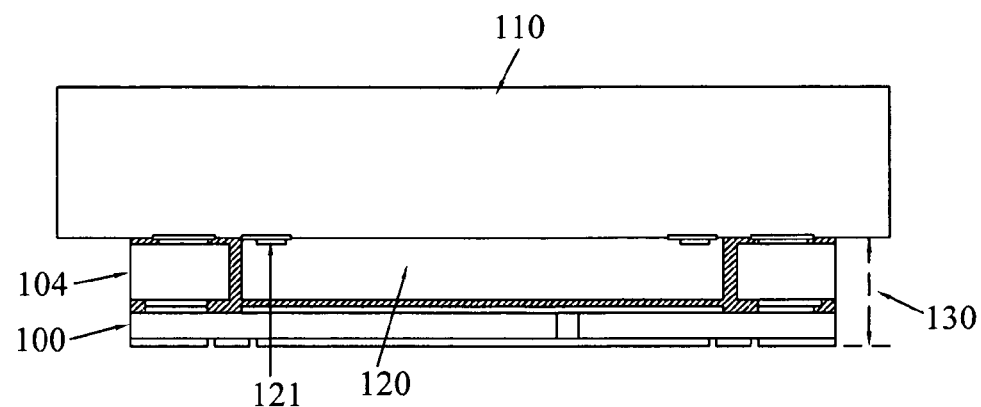
FIG. 7 illustrates a cross sectional view of the first substrate vacuum bonded onto the adhesive material according to the present invention.
Figure 7A:
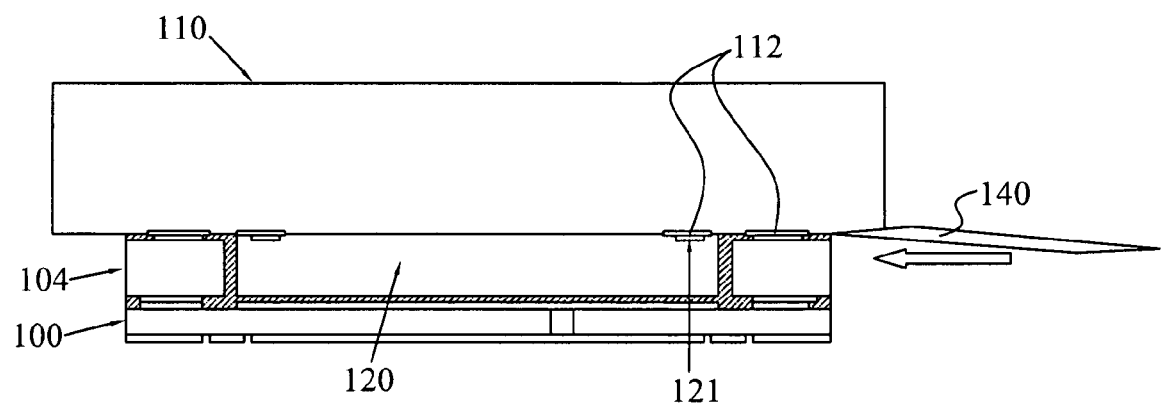
FIG. 7A illustrates a cross sectional view of separating the panel substrate from the tools according to the present invention.
Figure 8:
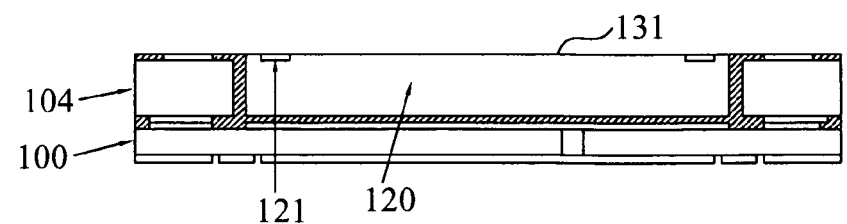
FIG. 8 illustrates a cross sectional view of panel substrate with die embedded inside according to the present invention.
Figure 9:
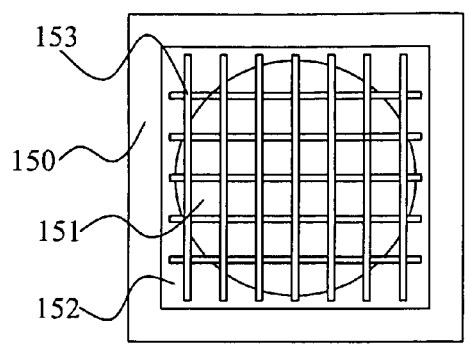
FIG. 9 illustrates a top view of saw wafer onto the frame type according to the present invention.

Thereafter, process for the present invention includes aligning and attaching the second substrate 104 on the temporary pattern glues 112 of the tools 110, for example the contact metal pads 105 may be attached on the temporary pattern glues 112 by aligning, shown in FIG. 4. Then, the dice 120 are prepared by the following steps, including back lapping the wafer to desired thickness, for example 127 or 200 micron, mounting the wafer on a frame 150 through a blue tape or UV tape 152, sawing the dice 151 on the frame 150 along the scribe lines 153, and wafer sorted with mapping, shown in FIG. 9. The die 120 with die pads 121 is aligned (by alignment key 111) and attached on the temporary pattern glue 112 of the tools 110 with face down which the die 120 is aligned and placed on the tool 110 by using pick and place fine alignment system with flip chip function to redistribute the desired dies on the tool with desired pitch, shown in FIG. 5. The temporary pattern glue 112 will stick the die 120 (active surface side) inside the opening window of the second substrate 104 on the tool 110. Subsequently, an adhesion material (filler) 121, for example elastic core paste material, is printed from the back side of the die 120 and the bottom side of the second substrate 104 which the adhesion material 122 is filled into the space (gap) between the die 120 and over the back side of the die 120 and the bottom side of the second substrate 104, shown in FIG. 6 (for light emitting package, the adhesion materials with see through function be used in this application). It is preferred to keep out the surface of the adhesion material 122 to cover the contact metal pads 106. Next, the first substrate 100 is vacuum bonding on the adhesion material 122, shown in FIG. 7. The curing process is used to cure the adhesion material 122 and bonding the first substrate 100 by UV or thermal curing. The panel bonder is used to bond the first substrate 100 on to the second substrate 104 and die 120 back side to form a assembly. The thickness 130 of the assembly can be controlled. Vacuum bonding is performed, followed by separating the tool 110 from the assembly after releasing the temporary pattern glue 112 to form panel substrate (with the die 120 embedded, the first substrate 100, the second substrate 104 and the adhesion material 122), shown in FIG. 8. The separating method of the panel substrate includes putting the object into hot plate or oven chamber, with chamber temperature above 100° C., the temporary pattern glue 112 becomes soft and reducing the adhesion, then using outside forcing to force the edge of panel substrate, and as the same time also using thin mechanical knife 140 (includes the thin steel wire with heater) to cut the temporary pattern glue 112 from the same edge of the panel substrate, and thereby the panel substrate will be separated from the tools 110, shown in FIG. 7A. Moreover, the surface cleaning of the panel substrate can be performed by solvent to remove the temporary pattern glues residue. In one embodiment, materials of the temporary pattern glues include polydimethyl-siloxane gum and resin dispersion.

Figure 10:
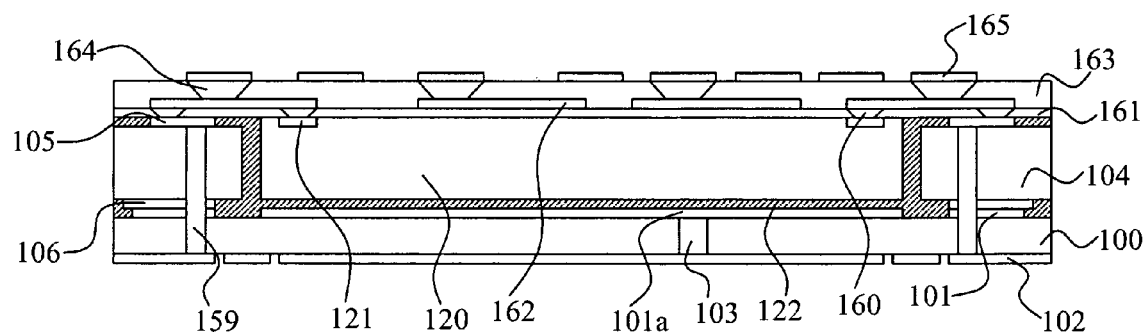
FIG. 10 illustrates a cross sectional view of a substrate with die embedded inside and with double side build up layers on top and bottom side according to the present invention.

Once the panel substrate separates from the tools 110, then, a clean up procedure is performed to clean the dice surface by wet and/or dry (plasma) clean. The following process is forming build up layers on top surface of the die and the second substrate 104, shown in FIG. 10, after forming the panel form substrate. Alternatively, the build up layers are also formed on the bottom side of the first substrate 100, it can be formed the top and bottom build-up layers at the same time by using the substrate/FPC process. The starting step of forming the build up layers is a first dielectric layer formed or coated on circuit side by a spin/spray process. The first dielectric layer 161 is then formed on the die 120 and the second substrate 104, with via holes formed therein, to open Al bonding pads 121 (I/O pads of die) and the contact metal pads 105 (I/O pads of substrates) by using a photolithography process, with exposing, developing, curing steps, and an etching process needed in some cases. Plasma clean step is then executed to clean the surface of via holes and Al bonding pads. Next, to perform CNC (computer numerical control) or laser drilling the through holes from the top contact metal pads 105 of the second substrate 104 to the bottom contact metal pads 106 of first substrate 100, and then filling a conductive material into the through holes to form conductive through holes 159. The conductive through holes 159 are formed to connect the top and bottom wiring of the second substrate 104 and top and bottom wiring of the first substrate 100. Next step is to sputter Ti/Cu as seed metal layers 160 on the first dielectric layer 161 and on via holes and through holes. Then, photo resistor (can be dry film lamination) is coated over the first dielectric layer 161 and seed metal layers 160, and by exposing, developing of the photo resist for forming the patterns of redistributed metal layers (RDL). Then, the electro plating is processed to form Cu/Au or Cu/Ni/Au as the RDL metal, followed by stripping the photo resist and metal wet etching to form the RDL metal trace 162 on the seed metal layers 160. In general, it can be used the above process to build the conductive through holes 159 and RDL at the same time.

Subsequently, the next step is to coat or print or laminate a second (top) dielectric layer on the first dielectric 161 and the RDL metal trace 162. The second dielectric layer 163 is then formed on the first dielectric 161 and the RDL metal trace 162, with UBM holes formed therein, to open the RDL metal trace 162 by using a photolithography process, with exposing, developing, curing steps, and an etching process needed in some cases. Next step is to sputter Ti/Cu (0.05/0.3 um) as seed metal layers 164 on the second dielectric layer 163 and on UBM (Under Bump Metallurgy) holes. Then, photo resistor (dry film lamination) is coated over the second dielectric layer 163 and seed metal layers 164, and by exposing, developing of the photo resist for forming the patterns of solder metal pads. Then, the electro plating is processed to form Cu/Ni/Au (3/3/0.2 um) as the solder metal pads 165 on the seed metal layers (UBM) 164, followed by stripping the photo resist and metal wet etching for cleaning the solder metal pads 165. It can repeat the procedures to form multi-RDL layers and dielectric layer on single and/or both side of panel substrate, such as seed layer, photo resist, E-plating or strip/etching. If the application does not have any components be built on the top, then, the cover layer can be laminated or coated on the top as cover layer to protect the RDL and easy to form the laser mark on the cover layer; the materials of cover layer can be PI film, rubber film, or dielectric layer.

Figure 11:
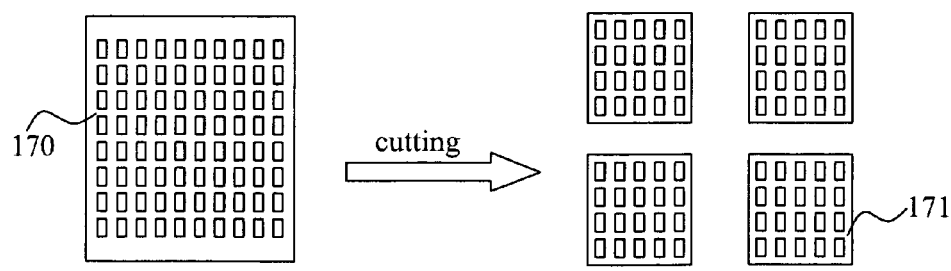
FIG. 11 illustrates a top view of panel substrate be cutting to sub-panel substrate for SMT and final testing according to the present invention.
Figure 13:
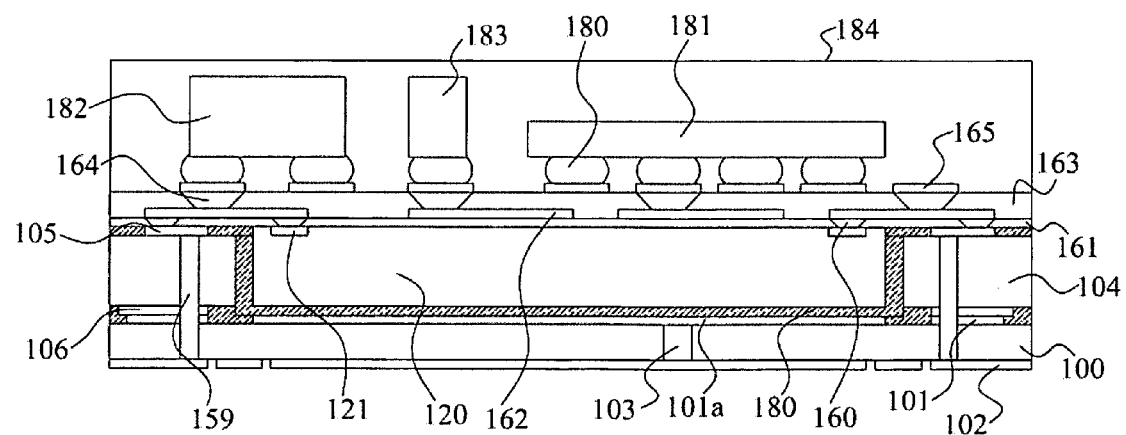
FIG. 13 illustrates a cross sectional view of metal cover mounted on top of system in package according to the present invention.
Figure 14:
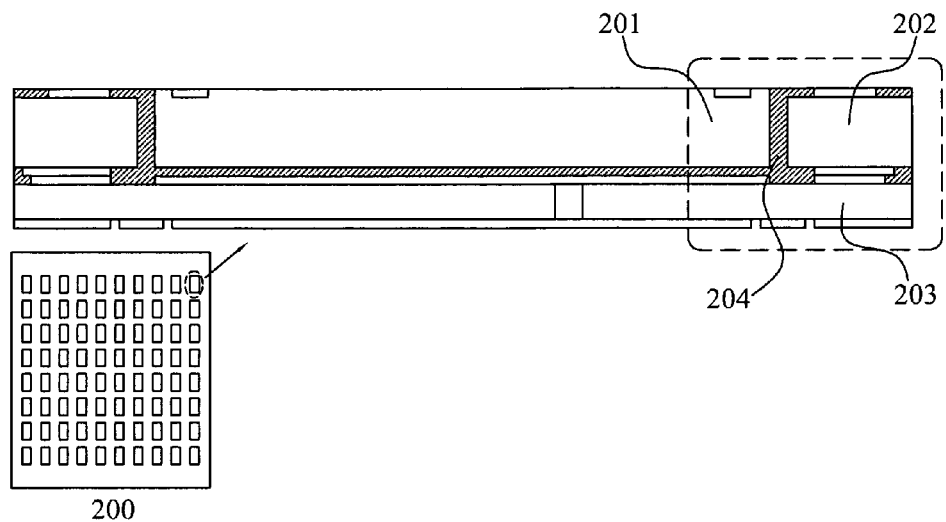
FIG. 14 illustrates a cross sectional view of the substrate structure according to the present invention.
Figure 15:
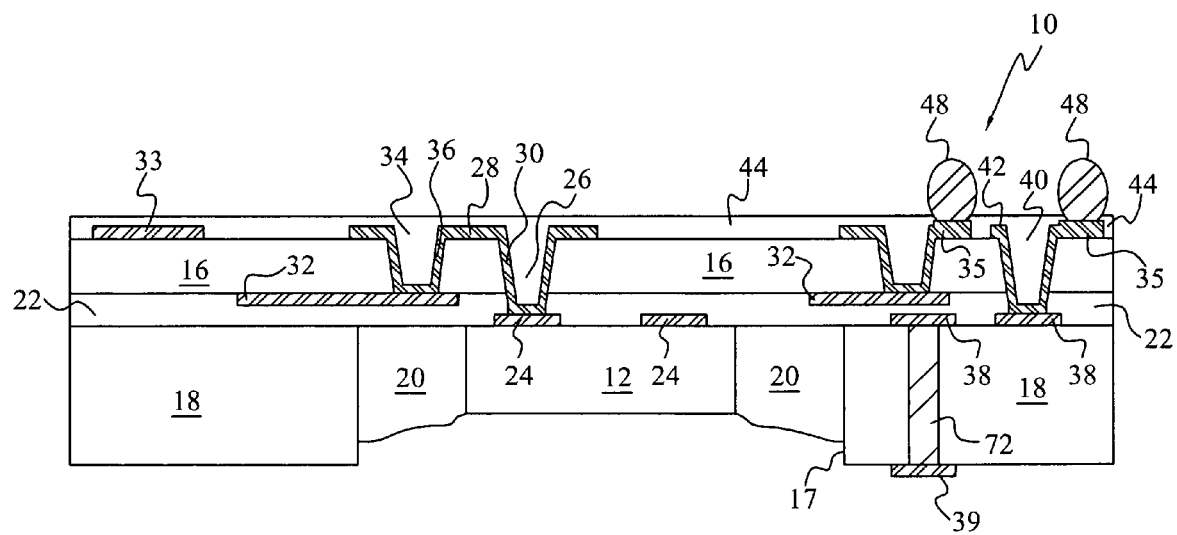
FIG. 15 illustrates a cross sectional view of prior art.
Figure 16:
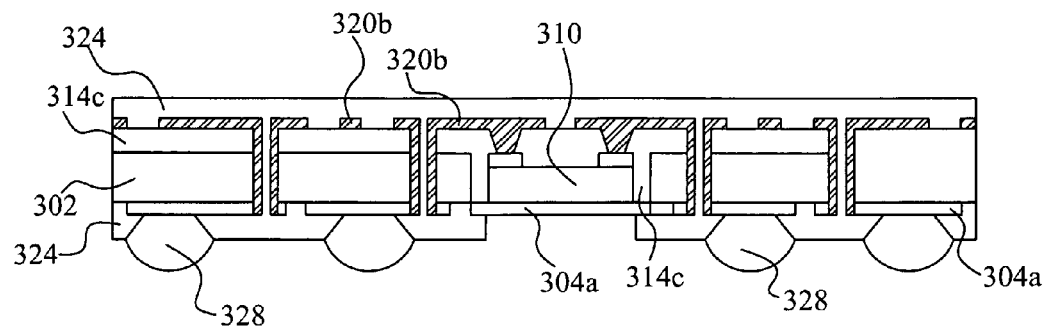
FIG. 16 illustrates a cross sectional view of prior art.

Thereafter, it may be to cut panel form substrate to sub-panel form substrate for final testing, for example cutting 20 inch size panel 170 to 10 inch size as 4 piece sub-panel 171, shown in FIG. 11. Next, ball placement or solder join 180 is formed on the solder metal pads 165 by printing. After the ball placement or solder paste printing, the heat re-flow procedure is performed to re-flow on the ball side (for BGA type). Then, passive components such as capacitor 182 and resistor 183, another die 181 for WL-CSP, CSP, BGA, Flip Chips, etc. package is mounting on the solder join 180, on top of circuit of die 120 (top of RDL), by using conventional SMT process, shown in FIG. 12. The sub-panel 171 mentioned above may be cut to multiple single units. Subsequently, the testing is executed. Module final testing is performed by using vertical or epoxy probe card to contact the terminal metal pads 102. In one embodiment, metal cover is formed to cover the capacitor 182, resistor 183 and another die 181 for EMI purpose, shown in FIG. 13. Substrate structure of a single unit of panel form substrate 200 may be referred to FIG. 14 which includes dice 201, the first substrate 203 with wiring circuit pattern on top and bottom side thereof, the second substrate 202 with die opening window and wiring circuit pattern on top and bottom surface thereof, and adhesion material (stress buffer) 204. After the testing, the packages are respectively picked and placed the package on the tray or tape and reel.

Figure 17:
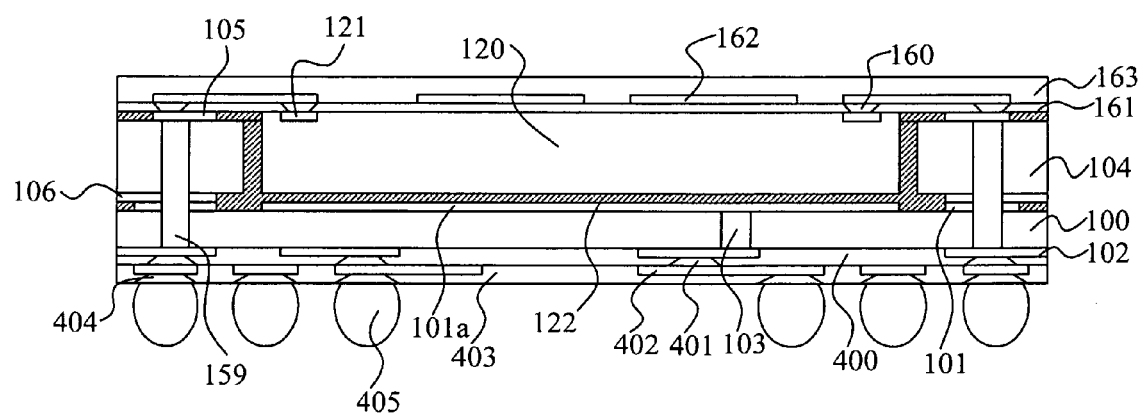
FIG. 17 illustrates a cross section view of a substrate with die embedded inside and with double side build up layers on top and bottom side with BGA format according to the present invention.
Figure 18:
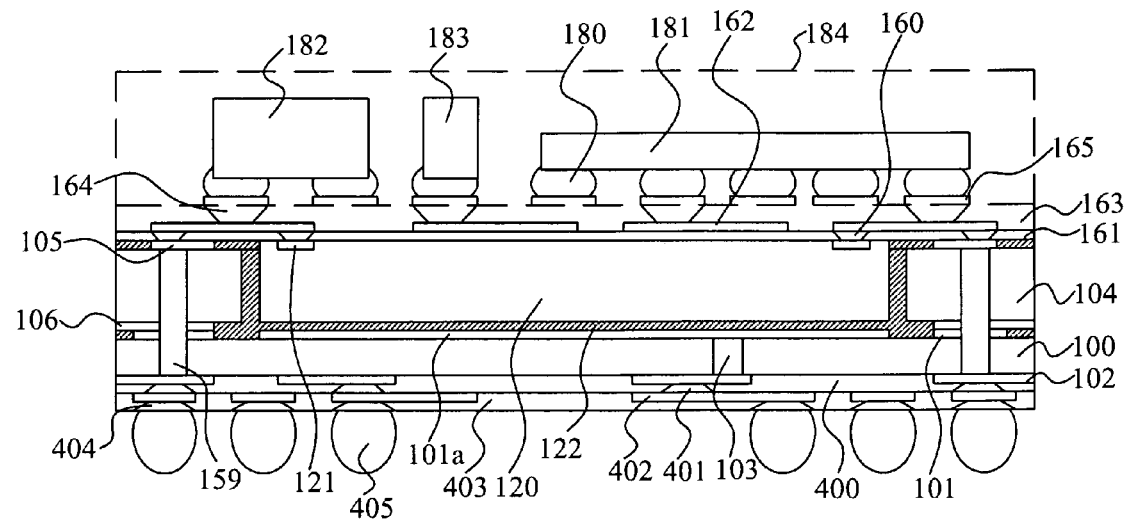
FIG. 18 illustrates a cross section view of system in package structure with BGA format according to present invention.

Another embodiment of the present invention is the final terminal format which can be BGA form, shown as FIG. 17 and FIG. 18. In the FIG. 17 and FIG. 18, both of the package structures comprise top build up layers and bottom build up layers. The formation of the top build up layers and bottom build up layers are similar with the FIGS. 10 and 13, and the detailed description is omitted. The bottom build up layers includes a dielectric layer 400, via 401, RDL 402, a dielectric layer 403, via (UBM) 404, and solder ball 405. The solder ball 405 is formed on via (UBM) 404 by printing.

Figure 19:
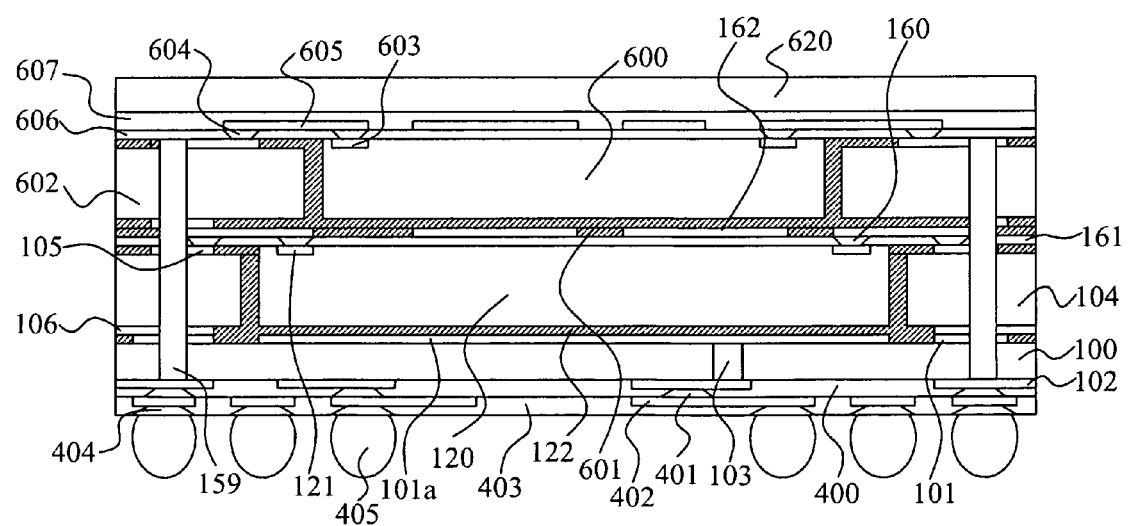
FIG. 19 illustrates a cross section view of multi-chips packaging with stacking structure according to present invention.

Another embodiment of the present invention is stacking at least two substrates with die (can be multi-chips) embedded inside together and has conductive through holes for inter-connecting the electrical signals, shown as FIG. 19. The package structure of the FIG. 19 comprises a chip 120 and a chip 600 with a Al bonding pads 603, top build up layers, middle build up layers and bottom build up layers. The formation of the top build up layers, middle build up layers and bottom build up layers are similar with the FIGS. 10 and 13, and the detailed description is omitted. The top build up layers includes a dielectric layer 606, via 604, RDL 605 and a dielectric layer 607. The die/chip 600 has back side with adhesive material (stress buffer) 601 attached on the die metal pads 162 of the second substrate 104. A top core paste 620 is optionally formed on the dielectric layer 607. The conductive through holes 159 may be formed by CNC (computer numerical control) or laser drilling.

Figure 22:
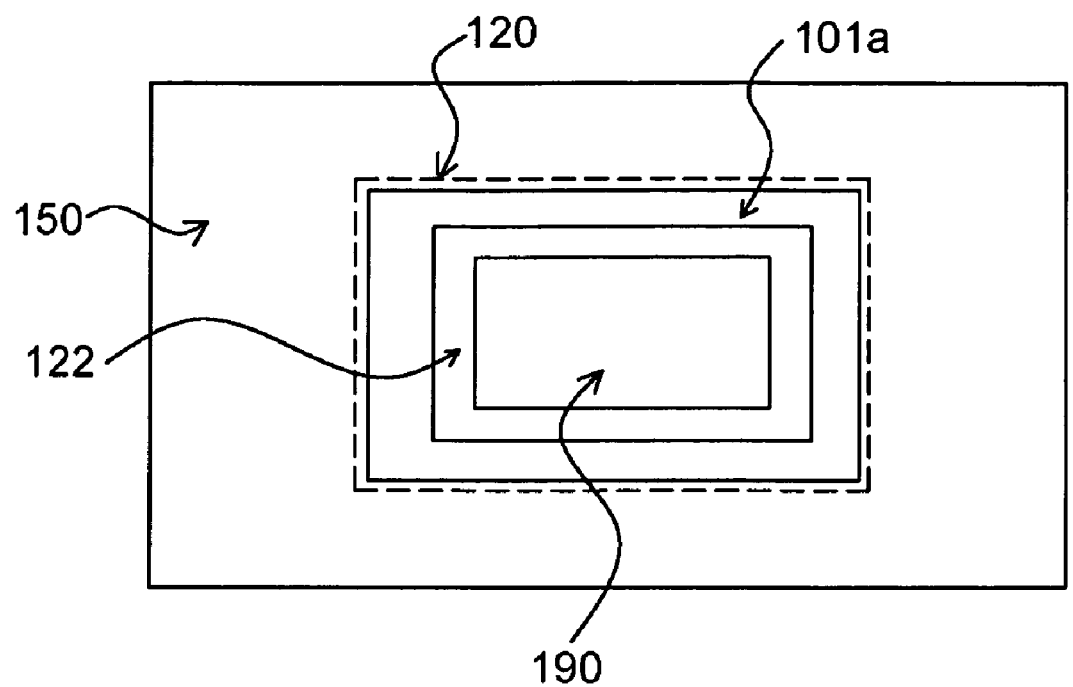
FIG. 22 illustrates a top view of chip packaging with stacking structure according to present invention.

Another embodiment of the present invention includes preparing a panel substrate with embedded dice inside, wherein the first substrate 100 could not have the connecting conductive through holes, and the Au or Au/Ag metal layer 123 is formed on the bottom surface of the die/chip 120 of the second substrate 104, which could be formed in wafer process, shown as FIG. 20. Then, the laser is introduced to cut the backside of the first substrate 100 and formed an opening hole in the first substrate 100, to expose a part of the backside of the Au or Au/Ag metal layer 123 of chip/die 120. When the $CO_2$ laser is utilized to cut the first substrate 100, the laser beam will stop on the Au or Au/Ag metal layer 123, and would not to affect the Au or Au/Ag metal layer 123. Thereafter, the sputtering technique is used to sputter metal (e.g. Cu or Ti/Cu) on the outside of the exposed Au or Au/Ag metal layer 123 of the chip/die 120, and formed the metal layer 190 which includes E-plating Cu or Cu/Au or Cu/Ni/Au metal with pattern. Mechanical, electrical and thermal conductivity performance can be strengthened through adjusting the thickness of metal layer or designing the exposure pattern of opening holes area. The exposure area of the opening holes, i.e. the area of metal layer 190, is smaller than the area of the die/chips 120, the area of the die metal pads 101a and adhesive material 122, shown as FIG. 22. After the sputtering, the wiring circuit 191 is formed on the bottom surface of said metal layer 190 of the first substrate 100, and said wiring circuit 191 includes CCL Cu and E-plating Cu.

The advantages of the present inventions are:

The process is simple for forming Panel level type and is easy to control the roughness of panel surface. The thickness of panel is easy to be controlled and die shift issue will be eliminated during process. The injection mold tool is omitted, CMP polish process will not be introduced either, and no warp result from the process. The panel substrate is easy to be processed by panel level packaging process. CTE match under the build up layers (PCB and substrate) has better reliability that no thermal stress results in X/Y direction on board and by using elastic dielectric layers to absorb the stress from Z direction. Single material is sawed during simulation (cutting).

The substrate is pre-prepared with pre-form die opening window, inter-connecting through holes (if it is needed) and terminal contact metal pads (for organic substrate); the size of die opening window is equal to die size plus around >100 um-200 um per side; it can be used as stress buffer releasing area by filling the adhesive elastic core paste materials to absorb the thermal stress due to the CTE between silicon die and substrate (FR5/BT) is difference, additionally, it can fill the elastic dielectric materials to the gap between die edge and side wall of the substrate to absorb the mechanical bending and/or thermal stress due to the CTE mismatch. The packaging throughput will be increased (manufacturing cycle time was reduced) due to apply the simple build up layers on top the surface of die and bottom site at the same time. The terminal pads are formed on the opposite side of the dice active surface.

The process is simple for forming Panel level type and is easy to adjust the mechanical, electrical and thermal conductivity performance through the process. It can easy to obtain the wanted performance, by adjust the thickness of plating metal layer or designing the exposure pattern of opening holes area. Because the adhesive material not filled between said Au or Au/Ag layer of the die bottom side and said E-plating Cu metal layer, and both could direct contact.

The dice placement process is using the pick and place process. Elastic core paste (resin, epoxy compound, silicone rubber, etc.) is refilled the space between the dice edge and the sidewall of the through holes then bonding the first substrate for thermal stress releasing buffer in the present invention, then, vacuum heat curing is applied. CTE mismatching issue is overcome during panel form process. The deepness between the die and substrate is about 25 um, and the dielectric layer and RDL are formed on both the upper and lower surface of the panel. Only silicone dielectric material (preferably materials—siloxane polymers) is coated on the active surface and the substrate (preferably FR45 or BT) surface. The contact pads are opened by using photo mask process only due to the dielectric layer is photosensitive layer for opening the contacting open. The die and substrates (both second and first substrates) be bonded together. The reliability for both package and board level is better than ever, especially, for the board level temperature cycling test, it was due to the CTE of substrate and PCB mother board are identical, hence, no thermal mechanical stress be applied on the solder bumps/balls; for the board level mechanical bending test, it was due to bottom side of substrate to support the mechanical strength allowing absorb the stress in top side die area and boundary area; and thickness of the package with protection is extremely thin which is less than 200-300 um. The cost is low and the process is simple. It is easy to form the multi-chips package as well (can be multi-chips with side by side embedded into panel substrate).

Although preferred embodiments of the present invention have been described, it will be understood by those skilled in the art that the present invention should not be limited to the described preferred embodiments. Rather, various changes and modifications can be made within the spirit and scope of the present invention, as defined by the following Claims.

What is claimed is:

1. A structure of a semiconductor device package, comprising:
    a first substrate with a die metal pad and an opening hole area, a first wiring circuit on a top surface of said first substrate and a second wiring circuit on a bottom surface of said first substrate;
    a die disposed on said die metal pad and said opening hole area;
    a second substrate with a die opening window for receiving said die, a third wiring circuit on top surface of said second substrate and a fourth wiring circuit on bottom surface of said second substrate;
    a metal layer embedded into said opening hole area of said first substrate and contacted between the backside of said die and said second wiring circuit of said first substrate; and
    an adhesive material filled into the gap between back side of said die and top surface of said first substrate except said opening hole area; and between the side wall of said die and the side wall of said die opening window and the bottom side of said second substrate.

2. The structure of claim 1, further comprising conductive through holes formed by passing through said first substrate and/or said second substrate to connect said first, second, third and fourth wiring circuits.

3. The structure of claim 1, further comprising a first dielectric layer formed on said die and said second substrate, wherein said first dielectric layer has first openings for via formed therein to connect die metal contact (I/O) pad of said die and said first wiring circuit, and redistributed metal layers formed on said first dielectric layer to connect said die metal contact (I/O) pad through via.

4. The structure of claim 3, further comprising a second dielectric layer formed on said first dielectric layer and said redistributed metal layers, wherein said second dielectric layer has second openings for under bump metallurgy formed therein to connect said redistributed metal layers, and solder metal pads formed on said under bump metallurgy.

5. The structure of claim 4, further comprising a third dielectric layer formed under bottom side of said first substrate and said fourth wiring circuit, wherein said third dielectric layer has third openings for under bump metallurgy formed therein to connect said fourth wiring circuit, and solder metal pads formed on said under bump metallurgy.

6. The structure of claim 5, further comprising conductive bumps coupled to said solder metal pads.

7. The structure of claim 4, further comprising plurality of CSP, WL-CSP, BGA, flip chip and passive components coupled to said solder metal pads through conductive bumps.

8. The structure of claim 1, further comprising metal on the sidewall and edge corner of said die opening window of second substrate.

9. The structure of claim 1, further comprising lens disposed on said die and said second substrate for lighting package application;
    wherein the die includes a light emitting element and a solar cell (PV).

10. The structure of claim 1, wherein the material of said first and second substrate includes epoxy type FR5 or FR4.

11. The structure of claim 1, wherein the material of said first and second substrate includes BT, silicon, PCB (print circuit board) material, glass, ceramic or alloy metal.

12. The structure of claim 1, further comprising second dice embedded inside said second substrate stacking on the first substrate with said first dice embedded inside.

13. The structure of claim 1, wherein said adhesive material includes elastic core paste material to act as stress buffer.

14. The structure of claim 1, further comprising an Au or Au/Ag layer formed on a bottom surface of said die.

15. The structure of claim 1, where said metal layer includes E-plating Cu or Cu/Ni/Au metal, which formed on the sputtering and E-plating metal; wherein the sputtering metal includes Cu or Ti/Cu.

* * * * *